United States Patent
Yun (10) Patent No.: US 7,737,660 B2
(45) Date of Patent: Jun. 15, 2010

(54) HYBRID BATTERY AND FULL CHARGE CAPACITY CALCULATION METHOD THEREOF

(75) Inventor: Changyong Yun, Yongin-si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 459 days.

(21) Appl. No.: 11/843,586

(22) Filed: Aug. 22, 2007

(65) Prior Publication Data

US 2008/0048621 A1    Feb. 28, 2008

(30) Foreign Application Priority Data

Aug. 24, 2006  (KR) ...................... 10-2006-0080641

(51) Int. Cl.
*H01M 10/44*    (2006.01)
*H01M 10/46*    (2006.01)

(52) U.S. Cl. .................................... 320/132

(58) Field of Classification Search ................ 320/107, 320/112, 132, 149; 324/426, 427, 430, 433
See application file for complete search history.

(56) References Cited

U.S. PATENT DOCUMENTS

| | | | | |
|---|---|---|---|---|
| 5,284,719 A | * | 2/1994 | Landau et al. | 324/427 |
| 5,315,228 A | * | 5/1994 | Hess et al. | 320/106 |
| 5,440,221 A | * | 8/1995 | Landau et al. | 320/155 |
| 5,955,869 A | * | 9/1999 | Rathmann | 320/132 |
| 6,577,135 B1 | * | 6/2003 | Matthews et al. | 324/426 |
| 2003/0193318 A1 | * | 10/2003 | Ozawa et al. | 320/132 |

FOREIGN PATENT DOCUMENTS

| | | |
|---|---|---|
| JP | 2002-063944 | 2/2002 |
| JP | 2002-243813 | 8/2002 |

OTHER PUBLICATIONS

Patent Abstracts of Japan, Publication No. 2002-063944, dated Feb. 28, 2002, in the name of Mitsuru Horie, et al.
Patent Abstracts of Japan, Publication No. 2002-243813, dated Aug. 28, 2002, in the name of Norihiko Hirata.

* cited by examiner

*Primary Examiner*—Edward Tso
(74) *Attorney, Agent, or Firm*—Christie, Parker & Hale, LLP (57) ABSTRACT

A hybrid battery and full charge capacity calculation method thereof. A full charge capacity is calculated for each battery at at least two discharge voltage levels, and a total full charge capacity is calculated by adding the calculated full charge capacity of the discharging battery to a full charge capacity of a non-discharging battery. A hybrid battery includes: a first power source and a second power source; a sense resistor that senses and outputs current information of at least one of the first power source or the second power source; and a fuel gauge circuit that calculates a first accumulated discharge amount using the current information from the sense resistor when a voltage of a currently discharging one of the first or second power source reaches a first discharge voltage level, and to add a first capacity corresponding to the first discharge voltage level to the first accumulated discharge amount.

18 Claims, 7 Drawing Sheets

HYBRID BATTERY AND FULL CHARGE CAPACITY CALCULATION METHOD THEREOF

CROSS-REFERENCE TO RELATED PATENT APPLICATION

This application claims priority to and the benefit of Korean Patent Application No. 10-2006-0080641 for "Hybrid Battery and Full Charge Capacity Calculation Method Thereof," filed on Aug. 24, 2006, in the Korean Intellectual Property Office, the entire content of which is incorporated herein by reference.

BACKGROUND OF THE INVENTION

1. Field of the Invention

The present invention relates to a hybrid battery and full charge capacity calculation method thereof.

2. Discussion of Related Art

Generally, a portable electronic device receives a supply of power from a chargeable battery, and a usable time of the portable electronic device depends on the usable time of the battery as the power supply. Therefore, the battery is charged frequently to extend the usable time of the portable electronic device.

To maximize the usable time of the portable electronic device, one known method is to mount two batteries to a portable electronic device. For example, two batteries that have the same size and the same chemical property can be mounted to the same portable electronic device.

However, this method makes the price of the battery increase because not only the circuit used to control the charge and discharge has to be installed to each battery but also the fuel gauge circuit or the micro computer for calculating the remaining capacity of each battery is also provided.

Also, such conventional battery needs extra space because the shape and chemical property of the battery cells that are installed in each battery are typically completely the same, such that there is a problem of reduced energy efficiency per volume.

A quantity (or concept) known as the full charge capacity (FCC) is used as a standard capacity to indicate the accurate remaining capacity (RC) of the battery. In this case, the remaining capacity illustrates the relative state of charge (RSOC) as a percentage of the current full charge capacity. The full charge capacity represents the chargeable maximum capacity of the battery and it gradually becomes smaller as the number of charge and discharge cycles increases. Therefore, the full charge capacity is calculated as the number of charge and discharge cycles increases. According to a conventional calculation method, the full charge capacity is calculated by starting to discharge the battery when the battery is fully charged, and keeping track of the total amount of discharge until the voltage level of the battery reaches an end of discharge voltage level (EDV). Then, the total amount of discharge, which is calculated until very close to the full discharge, is used as the standard capacity to calculate the full charge capacity.

However, according to such conventional method of calculating the full charge capacity, the capacity is calculated at one discharge voltage level prior to the complete discharging, and the remaining capacity is calculated therefrom. Hence, it is difficult to calculate the remaining capacity of the battery when the battery is recharged prior to reaching the full discharge voltage level.

SUMMARY OF THE INVENTION

In embodiments according to the present invention, a hybrid battery and full charge capacity calculation method of the hybrid battery is provided. According to the method, the voltage level of the currently discharging battery is detected, and a full charge capacity is calculated at at least two discharge voltage levels. Then, the calculated full charge capacity of the discharging battery and a full charge capacity of a non-discharging battery are added together so that the remaining capacity can be accurately calculated.

Aspects according to embodiments of the present invention include a hybrid battery having at least two batteries that are different in at least one of the shape, chemical property, capacity or charge voltage. Also, aspects according to embodiments of the present invention include a hybrid battery having one circuit for capacity calculation and/or power control.

Other aspects according to embodiments of the present invention provide a hybrid battery and full charge capacity calculation method thereof. According to an exemplary embodiment, a remaining capacity of a hybrid battery can be accurately calculated by sensing the discharging voltage of a currently discharging battery, calculating full charge capacity at at least two discharge voltage levels, and adding the full charge capacity of the currently discharging battery and the full charge capacity of the currently non-discharging battery together to calculate a total full charge capacity for the hybrid battery.

In an exemplary embodiment according to the present invention, a hybrid battery includes: a first power source adapted to output a first voltage; a second power source, which is parallel to the first power source and adapted to output a second voltage; a sense resistor, which is in series with the first power source and the second power source and adapted to sense and output current information of at least one of the first power source or the second power source; and a fuel gauge circuit adapted to calculate a first accumulated discharge amount using the current information from the sense resistor when a voltage of a currently discharging one of the first power source or the second power source reaches a first discharge voltage level, and to add a first capacity corresponding to the first discharge voltage level to the first accumulated discharge amount to calculate a first full charge capacity.

The first capacity may be calculated by multiplying a previous full charge capacity with a percentage of remaining capacity corresponding to the first discharge voltage level.

The fuel gauge circuit may be further adapted to calculate a second accumulated discharge amount using the current information from the sense resistor when the voltage of the currently discharging one of the first power source or the second power source reaches a second discharge voltage level, wherein the second discharge voltage level is lower than the first discharge voltage level, and to calculate a second full charge capacity by adding a second capacity corresponding to the second discharge voltage level to the second accumulated discharge amount.

The second capacity may be calculated by multiplying a previous full charge capacity with a percentage of remaining capacity corresponding to the second discharge voltage level.

The fuel gauge circuit may include: a first discharge voltage level detector for detecting at least two discharge voltage levels different from each other while the first power source is discharging; a second discharge voltage level detector for detecting at least two discharge voltage levels different from each other while the second power source is discharging; an accumulated discharge amount calculator for calculating an accumulated discharge amount using the current information from the sense resistor; and a capacity calculator for calculating a full charge capacity by adding remaining capacity corresponding to one of the discharge voltage levels to the accumulated discharge amount when the discharge voltage level obtained from the first discharge voltage level detector or the second discharge voltage level detector reaches a preset discharge voltage level.

The capacity calculator may calculate the first capacity by multiplying a percentage of remaining capacity corresponding to the discharge voltage level with a previous full charge capacity.

The fuel gauge circuit, after calculating the full charge capacity of the discharging one of the first power source or the second power source, may add a previously stored full charge capacity of a currently non-discharging one of the first power source or the second power source to calculate a new total full charge capacity.

The first power source and the second power source may include rechargeable batteries.

At least one of the first power source or the second power source may include at least one of a cylinder type lithium ion battery, a rectangular type lithium ion battery, a pouch type lithium polymer battery, and a pouch type lithium ion battery.

The first power source and the second power source may be different from each other in at least one of shape, chemical property, capacity or charge/discharge voltage.

Another exemplary embodiment according to the present invention provides a method of calculating a full charge capacity of a hybrid battery including a first power source and a second power source. The method includes calculating a first accumulated discharge amount of the first power source while the first power source is discharging, and determining whether a first discharge voltage level of the first power source has been reached; adding the first accumulated discharge amount of the first power source, which has been accumulated until the first discharge voltage level was reached for the first power source, to a first capacity of the first power source corresponding to the first discharge voltage level of the first power source, to calculate a first full charge capacity of the first power source; calculating a second accumulated discharge amount of the first power source while the first power source is discharging, and determining whether a second discharge voltage level of the first power source, which is lower than the first discharge voltage level of the first power source, has been reached; and adding the second accumulated discharge amount of the first power source, which has been accumulated until the second discharge voltage level was reached for the first power source, to a second capacity of the first power source corresponding to the second discharge voltage level of the first power source, to calculate a second full charge capacity of the first power source.

The first capacity or the second capacity of the first power source may be obtained, respectively, by multiplying a percentage of remaining capacity of the first power source corresponding to the respective first discharge voltage level or the second discharge voltage level of the first power source with a previous full charge capacity of the first power source.

After respective calculation of the first full charge capacity or the second full charge capacity of the first power source, the method may further include storing the first full charge capacity or the second full charge capacity, respectively, of the first power source in a memory.

After respective calculation of the first full charge capacity or the second full charge capacity of the first power source, the method may further include adding the first full charge capacity or the second full charge capacity, respectively, of the first power source to a previously stored full charge capacity of the second power source, to calculate a total full charge capacity.

The method may further include: calculating a first accumulated discharge amount of the second power source while the second power source is discharging, and determining whether a first discharge voltage level of the second power source has been reached; adding the first accumulated discharge amount of the second power source, which has been accumulated until the first discharge voltage level was reached for the second power source, to a first capacity of the second power source corresponding to the first discharge voltage level of the second power source, to calculate a first full charge capacity of the second power source; calculating a second accumulated discharge amount of the second power source while the second power source is discharging, and determining whether a second discharge voltage level of the second power source, which is lower than the first discharge voltage level of the second power source, has been reached; and adding the second accumulated discharge amount of the second power source, which has been accumulated until the second discharge voltage level was reached for the second power source, to a second capacity of the second power source corresponding to the second discharge voltage level of the second power source, to calculate a second full charge capacity of the second power source.

The first capacity or the second capacity of the second power source may be obtained, respectively, by multiplying a percentage of remaining capacity of the second power source corresponding to the respective first discharge voltage level or the second discharge voltage level of the second power source with a previous full charge capacity of the second power source.

After respective calculation of the first full charge capacity or the second full charge capacity of the second power source, the method may further include storing the first full charge capacity or the second full charge capacity, respectively, of the second power source in the memory.

After respective calculation of the first full charge capacity or the second full charge capacity of the second power source, the method may further include adding the first full charge capacity or the second full charge capacity, respectively, of the second power source to a previously stored full charge capacity of the first power source, to calculate another total full charge capacity.

Also, by adding the full charge capacity of a second power to the stored full charge capacity of the first power of non-discharging after each full charge capacity calculation step, it can be contained the step of calculating a total full charge capacity of the first power and a second power.

A hybrid battery and full charge capacity calculation method thereof according to exemplary embodiments of the present invention may be used to accurately calculate the remaining capacity of the battery by newly calculating the full charge capacity of the battery at at least two discharge voltage levels.

Also, a hybrid battery and full charge capacity calculation method thereof according to exemplary embodiments the present invention may be used to newly calculate a total full charge capacity of a hybrid battery by adding already (or previously) stored full charge capacity of a battery that is not currently discharging to a full charge capacity of the discharging battery after calculating the full charge capacity of the discharging battery. This way, a total remaining capacity calculation of a hybrid battery may be accurately performed.

BRIEF DESCRIPTION OF THE DRAWINGS

These and/or other aspects of the invention will become apparent and more readily appreciated from the following description of exemplary embodiments, taken in conjunction with the accompanying drawings of which.

DETAILED DESCRIPTION OF EMBODIMENTS

When at least two batteries are used together, a full charge capacity may be calculated for each battery, and a total full charge capacity may be calculated by adding the respective full charge capacities together. Exemplary embodiments of the present invention are related to such calculation method.

Hereinafter, exemplary embodiments of the present invention will be described with reference to the accompanying drawings.

Figure 1:
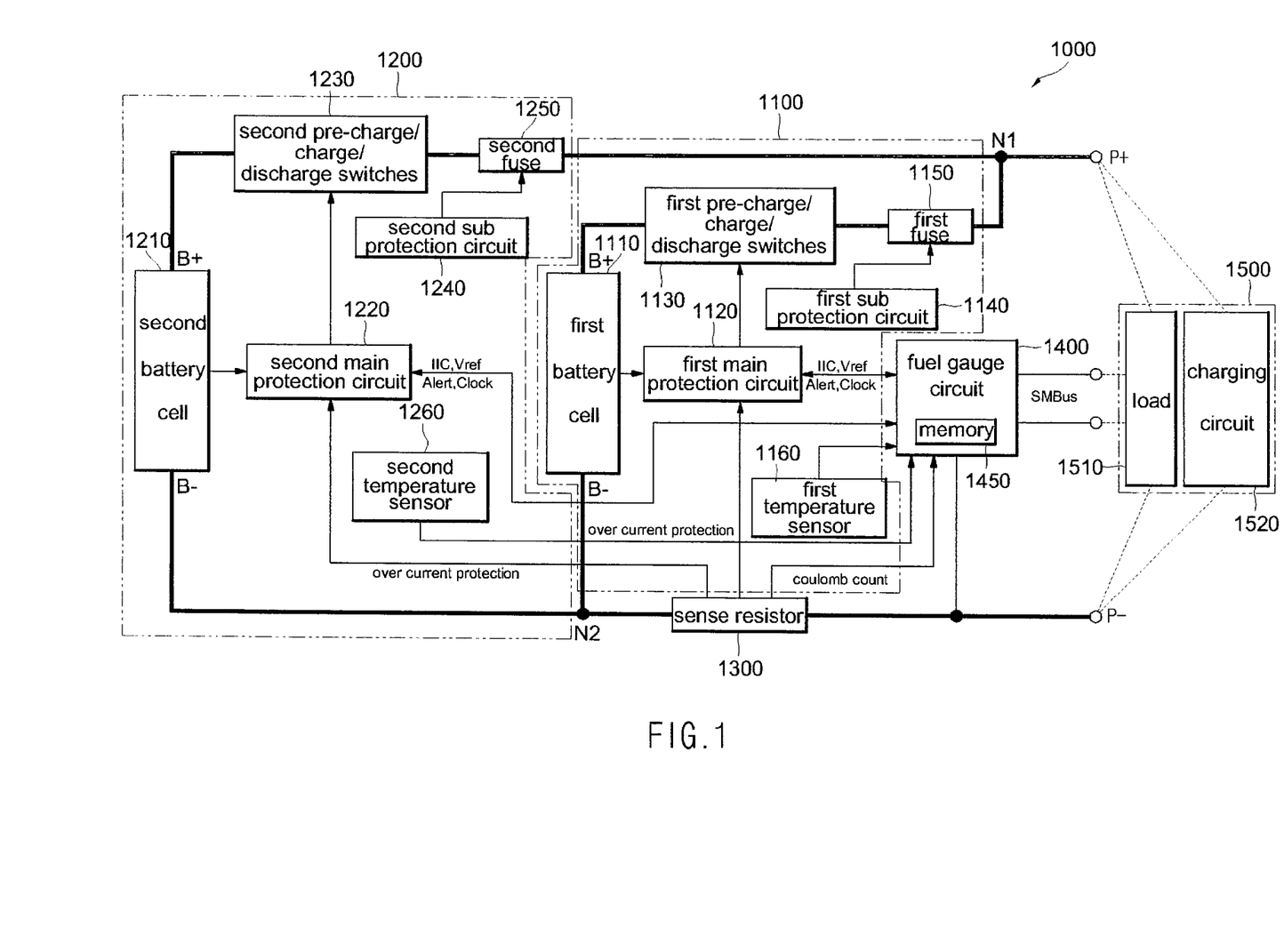
FIG. 1 is a block diagram of a hybrid battery of an embodiment according to the present invention.

FIG. 1 is a block diagram of a hybrid battery 1000 of an embodiment according to the present invention.

As illustrated in FIG. 1, a hybrid battery 1000 of an embodiment according to the present invention contains a first power source 1100, a second power source 1200, a sense resistor 1300, and a fuel gauge circuit 1400.

The first power source 1100 contains a first battery cell 1110, a first main protection circuit 1120, first pre-charge/charge/discharge switches 1130, a first sub protection circuit 1140 (or first support protection circuit or first auxiliary protection circuit), a first fuse 1150, and a first temperature sensor 1160. The first battery cell 1110 may be formed of at least one rechargeable battery (i.e., secondary battery) that can be charged and discharged and connected in series or parallel. For example, the rechargeable battery can include one or more of a cylinder type lithium ion battery, a rectangular type lithium ion battery, a pouch type lithium polymer battery, a pouch type lithium ion battery, or any equivalent or other suitable batteries known to those skilled in the art.

The first main protection circuit 1120 perceives (or detects) the charge voltage or the discharge voltage of the first battery cell 1110, and provides the result to the fuel gauge circuit 1400. Also, the first main protection circuit 1120 turns on or turns off the first pre-charge/charge/discharge switches 1130 using one or more control signals (for example, a charge stop signal, a charge start signal, a discharge stop signal and a discharge start signal) of the fuel gauge circuit 1400. Moreover, the first main protection circuit 1120 detects an electric current from the sense resistor 1300, and turns off the first pre-charge/charge/discharge switches 1130 if overcurrent (i.e., too much current) is detected. The working relationship between the first main protection circuit 1120 and the first pre-charge/charge/discharge switches 1130 will be described below in detail.

In one embodiment, the first pre-charge/charge/discharge switches 1130 include three switches that are connected in series in the charge and discharge path between the positive terminal (B+) of the first battery cell 1110 and the pack positive terminal (P+) (i.e., the positive terminal of the hybrid battery 1000). The first pre-charge/charge/discharge switches 1130 are turned on and turned off by the control signal of the first main protection circuit 1120. In other embodiments, the first pre-charge switch may not be included.

The first sub protection circuit 1140 blocks or interrupts the charge and discharge path by cutting off the first fuse 1150 in case that the first main protection circuit 1120 and/or the first pre-charge/charge/discharge switches 1130 are not operated properly.

The first fuse 1150 is connected in series with the charge and discharge path between the first pre-charge/charge/discharge switches 1130 and the pack positive terminal (P+). As described above, the first fuse 1150 can be cut off by the control signal of the first sub protection circuit 1140. In one embodiment, once cut off, the first fuse 1150 cannot be restored.

The first temperature sensor 1160 detects the temperature of the first battery cell 1110 and outputs to the fuel gauge circuit 1400. The fuel gauge circuit 1400 outputs the charge stop signal or the discharge stop signal to the first main protection circuit 1120 when the temperature from the first temperature sensor 1160 is more than the allowable temperature, and the first main protection circuit 1120 blocks or interrupts the charge and discharge path by turning off at least one of the first pre-charge/charge/discharge switches 1130. In one embodiment, the fuel gauge circuit 1400 uses the temperature detected by the first temperature sensor for the purposes of capacity correction of the battery. The correction method of the capacity of the battery using or based on temperature is already known to those skilled in the art, so that it will not be described in detail.

The second power source 1200 contains a second battery cell 1210, a second main protection circuit 1220, second pre-charge/charge/discharge switches 1230, a second sub protection circuit 1240, a second fuse 1250, and a second temperature sensor 1260. The second battery cell 1210 may be formed of at least one rechargeable battery (i.e., secondary battery) that can be charged and discharged and connected in series or parallel. For example, the secondary battery can be a cylinder type lithium ion battery, a rectangular type lithium ion battery, a pouch type lithium polymer battery, a pouch type lithium ion battery, or any equivalent or other suitable batteries known to those skilled in the art.

In one embodiment, the first battery cell 1110 of the first power source 1100 and the second battery cell 1210 of the second power source 1200 can be different from each other in the shape, chemical property, capacity, charge voltage and/or charge electric current. For example, when the first battery cell 1110 is a cylinder type lithium ion battery, the second battery cell 1210 can be a rectangular type lithium ion battery, a pouch type lithium polymer battery, a pouch type lithium ion battery or any equivalent or other suitable battery. Also, when the first battery cell 1110 is a lithium battery cell, the second battery cell 1210 can be a nickel-cadmium battery, a nickel-hydrate battery, or any equivalent or other suitable battery. Also, the capacity of the first power source 1100 and the capacity of the second power source 1200 can be different from each other. Moreover, the charge voltage and the charge current of the first power source 1100 and the charge voltage and the charge current of the second power source 1200 can be different from each other.

The second main protection circuit 1220 perceives (or detects) the charge voltage or the discharge voltage of the second battery cell 1210, and provides the result to the fuel gauge circuit 1400. Also, the second main protection circuit 1220 turns on or turns off the second pre-charge/charge/discharge switches 1230 using one or more control signals (for example, a charge stop signal, a charge start signal, a discharge stop signal and a discharge start signal) of the fuel gauge circuit 1400. Moreover, the second main protection circuit 1220 detects an electric current from the sense resistor 1300, and turns off the second pre-charge/charge/discharge switches 1230 if overcurrent (i.e., too much current) is detected.

In one embodiment, the second pre-charge/charge/discharge switches 1230 include three switches that are connected in series in the charge and discharge path between the positive terminal (B+) of the second battery cell 1210 and the pack positive terminal (P+) (i.e., the positive terminal of the hybrid battery 1000). The second pre-charge/charge/discharge switches 1230 are turned on and turned off by the control signal of the second main protection circuit 1220. In other embodiments, the second pre-charge switch may not be included.

The second sub protection circuit 1240 cuts off the second fuse 1250 in case that the second main protection circuit 1220 and/or the second pre-charge/charge/discharge switches 1230 are not operated properly.

The second fuse 1250 is connected in series with the charge and discharge path between the second pre-charge/charge/discharge switches 1230 and the pack positive terminal (P+). The second fuse 1250 can be cut off by the control signal from the second sub protection circuit 1240. In one embodiment, once cutoff, the second fuse 1250 cannot be restored.

The second temperature sensor 1260 detects the temperature of the second battery cell 1210 and outputs to the fuel gauge circuit 1400. The fuel gauge circuit 1400 outputs the charge stop signal or the discharge stop signal to the second main protection circuit 1220 when the temperature from the second temperature sensor 1260 is more than the allowable temperature, and the second main protection circuit 1220 blocks or interrupts the charge and discharge path by turning off at least one of the second pre-charge/charge/discharge switches 1230. In one embodiment, the fuel gauge circuit 1400 performs capacity correction using the temperature from the second temperature sensor 1260.

In other embodiments, the second fuse 1250 (or the first fuse 1150) and the second sub protection circuit 1240 (or the first sub protection circuit 1140) may not be used. By way of example, when the first fuse 1150 (or the second fuse 1250) is located between the node N1 and the pack positive terminal (P+), the first sub protection circuit 1140 (or the second sub protection circuit 1240) can be operated or activated when the first main protection circuit 1120 or the second main protection circuit 1220, or both the main protection circuits 1120 and 1220, are not operated normally (or properly). This way, the second fuse 1250 and the second sub protection circuit 1240 (or the first fuse 1150 and the first sub protection circuit 1140) may be omitted because only one fuse can be used to interrupt the current path for both the first and second batteries.

The sense resistor 1300 is located in the charge and discharge path between the node N2 and the pack negative terminal (P−). The sense resistor converts an applied voltage to an electric current and provides the electric current to the fuel gauge circuit 1400, the first main protection circuit 1120 and the second main protection circuit 1220. As described above, the sense resistor 1300 notifies the overcurrent condition to the first main protection circuit 1120 and the second main protection circuit 1220, and allows the fuel gauge circuit 1400 to calculate the accumulated discharge amount.

FIG. 1 illustrates that one sense resistor 1300 is used, but in other embodiments, a plurality of sense resistors (e.g., three sense resistors) 1300 can be used. For example, the sense resistor 1300 can be located between the negative terminal (B−) of the first battery cell 1110 and the node N2, the negative terminal (B−) of the second battery cell 1210 and node N2, and/or the node N2 and the pack negative terminal (P−). If the three sense resistors 1300 are used in such a manner, the overcurrent and the accumulated discharge amount of each of the first battery cell 1110 and the second battery cell 1210 can be detected more accurately, and also the total overcurrent and the accumulated discharge amount of both the first battery cell 1110 and the second battery cell 1210 can be detected more accurately. In one embodiment, a problem is that the pack manufacturing cost increases when multiple sense resistors are used.

The fuel gauge circuit 1400 can include a fuel gauge IC or a micro computer that include a central processing unit (CPU), memory such as RAM or ROM, and/or input and output ports. The fuel gauge circuit 1400 as explained receives the voltage information of the first battery cell 1110 from the first main protection circuit 1120 of the first power source 1100, receives the voltage information of the second battery cell 1210 from the second main protection circuit 1220 of the second power source 1200, and receives the current information (accumulated discharge amount) from the sense resistor 1300. Moreover, the fuel gauge circuit 1400 receives the temperature information of the first battery cell 1110 from the first temperature sensor 1160 of the first power source 1100 and receives the temperature information of the second battery cell 1210 from the second temperature sensor 1260 of the second power source 1200.

The fuel gauge circuit 1400 calculates full charge capacity (FCC) and/or the remaining capacity (RC) of the first power source 1100 and/or the second power source 1200 by performing coulomb count (current integration) based on the accumulated discharge amount obtained from the sense resistor 1300. The full charge capacity calculation method of the battery will be described in detail below. In one embodiment, the fuel gauge circuit 1400 calculates remaining capacity of the first power source 1100 and/or the second power source 1200, and transmits the combined remaining capacity of the two batteries to an external system 1500 having a load 1510 through the communication line such as the SMBus. Therefore, the external system 1500, through the load 1510, perceives as though it is connected to a single battery, and it is relatively easy to detect a total capacity.

In one embodiment, the fuel gauge circuit 1400 obtains the charge voltage information and/or the discharge voltage information from the first main protection circuit 1120 of the first power source 1100. When the charge voltage is determined to be an overcharge voltage, the fuel gauge circuit 1400 sends the stop charge signal to the first main protection circuit 1120, and when the discharge voltage is determined to be an overdischarge voltage, the fuel gauge circuit 1400 sends the discharge stop signal to the first main protection circuit 1200. In one embodiment, the first main protection circuit 1120 turns off the first charge switch when the charge stop signal input is received and turns off the first discharge switch when the discharge stop signal input is received.

Further, the fuel gauge circuit 1400 obtains the charge voltage information and the discharge voltage information from the second main protection circuit of the second power source 1200. When the charge voltage is determined to be an overcharge voltage, the fuel gauge circuit 1400 sends the charge stop signal to the second main protection circuit 1220, and when the discharge voltage is determined to be an over-discharge voltage, the fuel gauge circuit 1400 sends the discharge stop signal to the second main protection circuit 1220. In one embodiment, when the charge stop signal is inputted to the second main protection circuit, the second main protection circuit 1220 turns off the second charge switch, and turns off the second discharge switch when the discharge stop signal is received. Of course, the second main protection circuit 1220 turns off the second charge switch when the charge stop signal is inputted, and turns off the second discharge switch when the discharge stop signal is inputted.

In one embodiment, the fuel gauge circuit 1400 controls the first power source 1100 and the second power source 1200 such that only one of the first power source 1100 or the second power source 1200 provides power to an external system. For example, in one embodiment, when the fuel gauge circuit 1400 controls the first power source 1100 to provide electricity to the load 1510, the fuel gauge circuit 1400 outputs the charge stop signal and the discharge stop signal to the second power source 1200, such that the second power source 1200 is not charge by the first power source 1100. Of course, the discharge of the second power source 1200 is also blocked or interrupted. Also, when the fuel gauge circuit 1400 controls the second power source 1200 to provide electricity to the load 1510, the fuel gauge circuit 1400 outputs the charge stop signal and the discharge stop signal to the first power source 1100, such that the first power source 1100 is not charge by the second power source 1200. From this, the discharge of the first power source 1100 is also blocked or interrupted. In one embodiment, the above operation takes place when the load 1510 is connected to the pack positive terminal (P+) and the pack negative terminal (P−). In other words, when the charging circuit 1520 is connected to the pack positive terminal (P+) and the pack negative terminal (B−), the operation (or mechanism) may be slightly different. In other words, in other embodiments, the fuel gauge circuit 1400 may control the first power source 1100 and the second power source 1200 to be charged in sequence or to be charged concurrently.

Also, the fuel gauge circuit 1400 outputs the charge stop signal or the discharge stop signal to the first main protection circuit 1120 when the temperature information obtained from the first temperature sensor 1160 of the first power source 1100 is higher than an allowable/acceptable temperature, such that the first main protection circuit 1120 blocks or interrupts the charge and discharge path. In other words, the first main protection circuit 1120 turns off the first charge switch or the first discharge switch.

Also, the fuel gauge circuit 1400 outputs the charge stop signal or the discharge stop signal to the second main protection circuit 1220 when the temperature information obtained from the second temperature sensor 1260 of the second power source 1200 is higher than an allowable/acceptable temperature, such that the second main protection circuit 1220 blocks or interrupts the charge and discharge path. In other words, the second main protection circuit 1220 turns off the second charge switch or the second discharge switch.

Figure 2A:
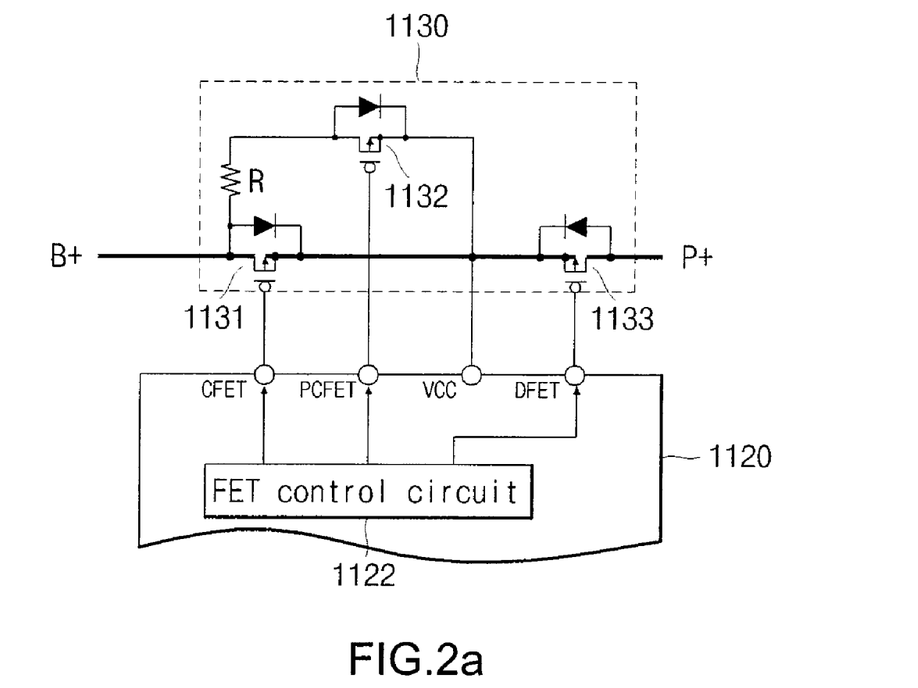
FIG. 2a is a circuit diagram that shows a relationship between pre-charge/charge/discharge switches and a main protection circuit in a hybrid battery.
Figure 2B:
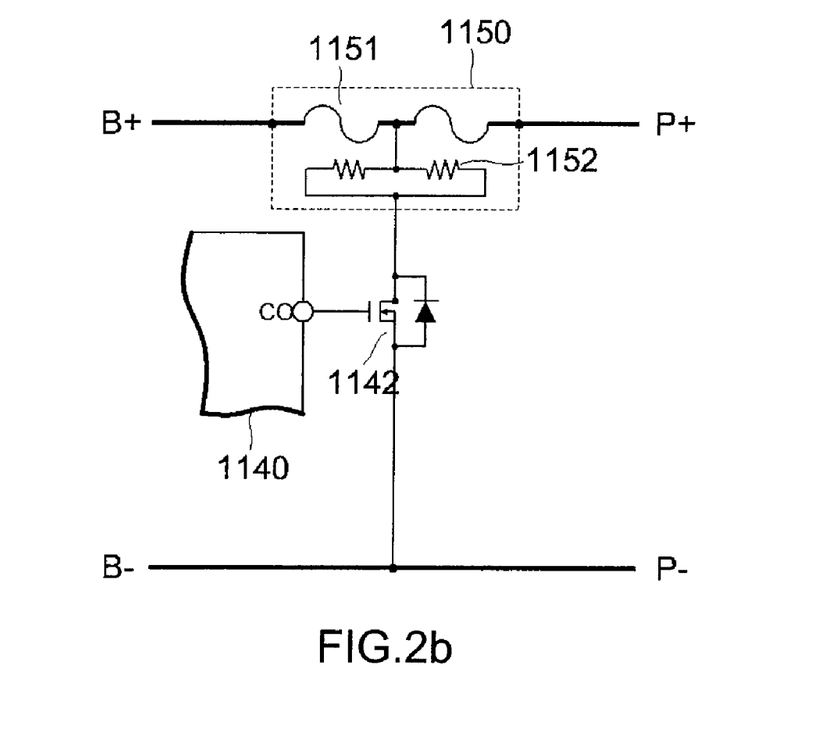
FIG. 2b is a circuit diagram that illustrates a relationship between a fuse and a support protection circuit (or sub protection circuit or auxiliary protection circuit) of an embodiment according to the present invention.

FIG. 2a is a circuit diagram that illustrates a relationship between the first pre-charge/charge/discharge switches 1130 and the first main protection circuit 1120 in a hybrid battery, and FIG. 2b is a circuit diagram that illustrates a relationship between the first fuse 1150 and the first sub protection circuit 1140 of an embodiment according to the present invention.

While the circuitry and configuration shown in FIG. 2a is that of the first main protection circuit 1120 and the first pre-charge/charge/discharge switches 1130, the circuitry and configuration can be applied equally as well to the second power source 1200. Therefore, the second main protection circuit 1220 and the second pre-charge/charge/discharge switches 1230 will not be discussed in detail.

The first charge switch 1131, the first precharge switch (or first preparation charge switch) 1132 and the first discharge switch 1133 are connected one after the other in the charge and discharge path between the positive terminal (B+) of the first battery cell 1110 and the pack positive terminal (P+). In more detail, the first charge switch 1131 and the first discharge switch 1133 are connected in series with the charge and discharge path, and the first precharge switch 1132 is connected in parallel to the charge and discharge path. In one embodiment, all switches 1131, 1132, 1133 are P channel field effect transistors (FETs) including the parasitic diode from the drain to the source but the present invention is not limited thereto. The source of the first charge switch and the source of the first discharge switch are connected to each other. Also, the drain of the first charge switch 1131 is connected with the positive terminal (B+) of the first battery cell 1110, and the drain of the first discharge switch 1133 is connected with the pack positive terminal (P+). Further, the source of the first precharge switch 1132 is connected with the source of the first charge switch 1131 and the source of the first discharge switch 1133, and the drain is connected with the drain of the first charge switch 1131 though the resistor R. In other embodiments, a capacitor C may be used for power source change control.

In addition, the gate of the first charge switch 1131, the gate of the first precharge switch 1132, and the gate of the first discharge switch 1133 are each controlled by the first main protection circuit 1120. For example, when the first main protection circuit 1120 applies a low signal to the gate of the first charge switch 1131 through the CFET terminal, the first charge switch 1131 is turned on, when the first main protection circuit 1120 applies a low signal to the gate of the first precharge switch 1132 through the PCFET terminal, the first precharge switch 1132 is turned on, and when a low signal is applied to the gate of the first discharge switch 1133 through the DFET terminal, the first discharge switch 1133 is turned on. Of course, in contrast, when the first main protection circuit 1120 applies a high signal to the gate of the first charge switch 1131 through the CFET terminal, the first charge switch 1131 is turned off, when the first main protection circuit 1120 applies a high signal to the gate of the first precharge switch 1132 through the PCFET terminal, the first precharge switch 1132 is turned off, and when the first main protection circuit 1120 applies a high signal to the gate of the first discharge switch 1133 through the DFET terminal, the first discharge switch 1133 is turned off. In one embodiment, the first main protection circuit 1120 includes a FET control circuit 1122 to control the gate voltage of each of the switches 1131, 1132, and 1133.

Using the above described configuration, the charging of the first battery cell 1110 is stopped (discharging is possible by the parasitic diode) when the first main protection circuit 1120 turns off the first charge switch 1131, the discharging of the first battery cell 1110 is stopped (charging is possible by the parasitic diode) when the first main protection circuit 1120 turns off the first discharge switch 1133. In one embodiment, when the voltage level of the first battery cell 1110 decreases below the over discharge voltage, for example, the first precharge switch 1132 supplies charging current at a lower level to the battery cell during a period of time (e.g., a predetermined period of time) to have the voltage level of the first battery cell 1110 to be sufficient for fast charging. The operation of the first charge switch 1131, the first precharge switch 1132, and the first discharge switch 1133 is already known to those skilled in the art, so that additional explanation will be omitted.

FIG. 2b illustrates the first sub protection circuit 1140 of the first power source 1100 and the first fuse 1150. Such configuration can also be applied to the second power source 1200. Therefore, the description of the configuration and operation of the second sub protection circuit 1240 of the second power source 1200 and the second fuse 1250 will not be provided.

As illustrated in the FIG. 2b, the first fuse 1150 is located in the charge and discharge path between the positive terminal (B+) of the first battery cell 1110 and the pack positive terminal (P+). Also, the first switch 1142 is connected in the charge and discharge path between the negative terminal (B−) of the first battery cell 1110 and the pack positive terminal (P−) to operate the first fuse 1150. Further, the first switch 1142 is connected with the CO terminal of the first sub protection circuit 1140.

In one embodiment, the first fuse 1150 includes at least one temperature fuse 1151 and a heating resistor 1152 which cuts the temperature fuse 1151 through heating and melting. In one embodiment, the first switch is an N channel field effect transistor but the present invention is not limited thereto.

Accordingly, when the first sub protection circuit 1140 applies a high signal to the gate of the first switch 1142 through the CO terminal, the first switch 1142 is turned on, and a charge current or a discharge current flows from the positive terminal (B+ or P+) to the negative terminal (B− or P−) through the temperature fuse 1151, the heating resistor 1152, and the source and drain of the first switch 1142. Therefore, the heating resistor 1152 is heated so that the temperature fuse 1151 is cut off, and the charge and discharge path is interrupted (e.g., permanently interrupted). The first sub protection circuit 1140 operates when the first main protection circuit 1120 or the first precharge/charge/discharge switch 1130 is not operated normally.

Figure 3:
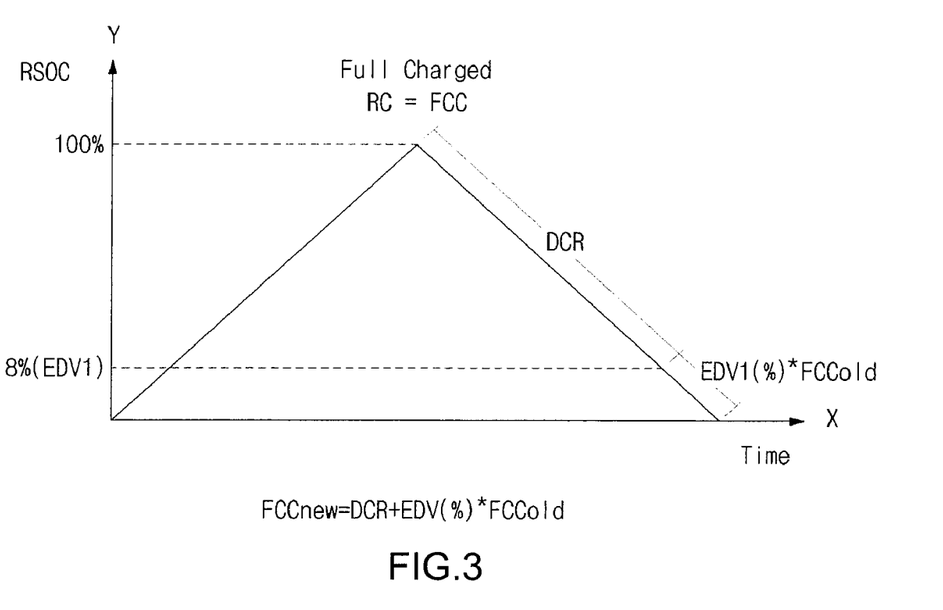
FIG. 3 is a graph that explains the full charge capacity calculation method of the battery.

FIG. 3 is a graph illustrating a full charge capacity calculation method of the battery.

In the graph, the X axis is the charge and discharge time, Y axis is the Relative State of Charge (RSOC), which is a relative charge status/condition of the battery. Also, RC stands for Remain Capacity that means the remaining capacity of the battery, DCR stands for Discharge Counter Register that means the accumulated discharge amount, and EDV stands for End of Discharge Voltage that means a discharge voltage level.

As illustrated in FIG. 3, the remaining capacity and the full charge capacity are the same when the battery is fully charged. Also, the calculated new full charge capacity (FCCnew) equals a sum of the accumulation discharge amount DCR and the EDV1(%)*FCCold when the battery has been discharged to the discharge voltage level (EDV1).

This can be represented as the mathematic equation below.

FCCnew=DCR+EDV1(%)*FCCold

Here, the EDV1 (%) is a percentage of the remaining capacity (or relative state of charge) at the discharge voltage level (EDV1), FCCold means a previous total full charge capacity.

Figure 4:
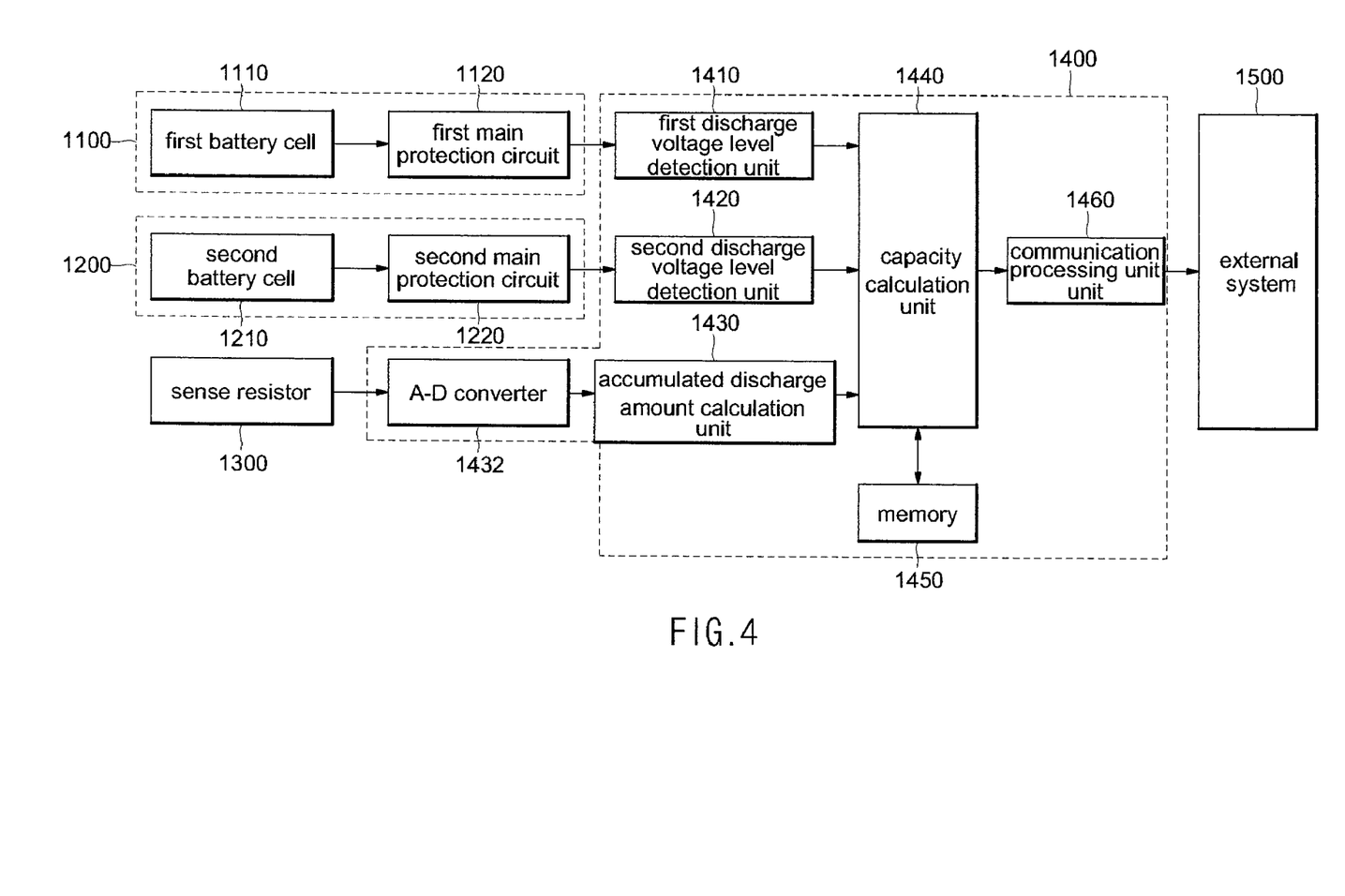
FIG. 4 is a block diagram that illustrates a fuel gauge circuit and nearby circuits thereof of an embodiment of a hybrid battery according to the present invention.

FIG. 4 is a block diagram that illustrates the fuel gauge circuit 1400 and nearby circuits of the hybrid battery 1000 in an embodiment according to the present invention.

As illustrated in FIG. 4, the first power source 1100 includes the first battery cell 1110 and the first main protection circuit 1120 that detects the voltage of the first battery cell 1110 and outputs the detected voltage to the fuel gauge circuit 1400. In one embodiment, the first main protection circuit 1120 includes an analog-to-digital converter for converting the analog voltage data of the first battery cell 1110 to the digital voltage data, and for outputting the digital voltage data to the fuel gauge circuit 1400.

Also, the second power source 1200 includes the second battery cell 1210 and the second main protection circuit 1220 that detects the voltage of the second battery cell 1210 and outputs the detected voltage to the fuel gauge circuit 1400. In one embodiment, the second main protection circuit 1220 includes an analog-to-digital converter for converting the analog voltage data of the second battery cell 1210 to the digital voltage data, and for outputting the digital voltage data to the fuel gauge circuit 1400.

Also, the sense resistor 1300 counts the electric charge that goes through it, and outputs the count to the fuel gauge circuit 1400. In one embodiment, the sense resistor 1300 outputs the analog data to the fuel gauge circuit 1400, and the fuel gauge circuit 1400 converts the analog data to the digital data using an A-D converter 1432.

The fuel gauge circuit 1400 includes a first discharge voltage level detection unit 1410, a second discharge voltage level detection unit 1420, an accumulated discharge amount calculation unit 1430, a capacity calculation unit 1440, a memory 1450, and a communication processing unit 1460. Of course, the fuel gauge circuit 1400 includes additional circuitry to control the charging and discharging states of the first power source 1100 and the second power source 1200. However, as such additional circuitry is not essential to a complete understanding of the present invention, it will not be described in detail.

The first discharge voltage level detection unit 1410 detects at least two discharge voltage levels (EDV1, EDV2) during the discharge of the first power source 1100, and transmits the determined discharge voltage levels to the capacity calculation unit 1440. Of course, the first discharge voltage level detection unit 1410 may not operate when the first power source 1100 is not discharging. In one embodiment, the discharge voltage level EDV1 is set to be higher than the other discharge voltage level EDV2.

The second discharge voltage level detection unit 1420 detects at least two discharge voltage levels (EDV1, EDV2) during the discharge of the second power source 1200, and transmits the determined discharge voltage levels to the capacity calculation unit 1440. Of course, the second discharge voltage level detection unit 1420 may not operate when the second power source 1200 is not discharging. In one embodiment, the discharge voltage level EDV1 is set to be higher than the other discharge voltage level EDV2.

The accumulated discharge amount calculation unit 1430 calculates the accumulated discharge amount at the discharge voltage levels (EDV1, EDV2) using the current information from the sense resistor 1300, and transmits the accumulated discharge amount to the capacity calculation unit 1440. In one embodiment, the analog-to-digital converter 1432 is located in front of (or before) the accumulated discharge amount calculation unit 1430 to convert the analog data of the sense resistor 1300 to digital data.

The capacity calculation unit 1440 calculates the full charge capacity (FCC) of the first power source 1100 or the second power source 1200 at at least two discharge voltage levels (EDV1, EDV2), respectively.

In other words, the capacity calculation unit 1440 of the fuel gauge circuit 1400 calculates the first accumulation discharge capacity (DCR1) (or first accumulated discharge amount) using the current information from the sense resistor 1300 when the voltage level of the currently discharging power source among the first power source 1100 or the second power source 1200 becomes the first discharge voltage level EDV1. Further, the capacity calculation unit 1440 calculates the first full charge capacity (FCCnew1) by adding the first accumulation discharge capacity (DCR1) (or first accumulated discharge amount) with a first capacity at the first discharge voltage level (EDV1). The first capacity equals to a product of the assigned percentage (EDV1 (%)) for the remaining capacity at the first discharge voltage level (EDV1) and a previous full charge capacity (FCCold).

The capacity calculation unit 1440 of the fuel gauge circuit 1400 calculates the second accumulation discharge capacity (DCR2) (or second accumulated discharge amount) using the current information from the sense resistor 1300 when the voltage level becomes the second discharge voltage level (EDV2) that is smaller than the first discharge voltage level (EDV1). The capacity calculation unit 1440 calculates the second full charge capacity (FCCnew2) by adding the second accumulation discharge capacity (DCR2) with a second capacity at the second discharge voltage level (EDV2). The second capacity equals to a product of the assigned percentage (EDV2 (%)) for the remaining capacity at the second discharge voltage level (EDV2) and a previous full charge capacity (FCCold).

Therefore, the accuracy of the full charge capacity improves and so the calculation of the remaining capacity becomes more accurate also, because the full charge capacity is calculated at two discharge voltage levels (EDV1, EDV2). The calculated full charge capacity is stored in the memory 1450. In the hybrid battery according to one embodiment of the present invention, the full charge capacity of the actually discharging battery is calculated by discharging selected one of the first power source 1100 or the second power source 1200. For example, when only the first power source 1100 is discharging, the full charge capacity of the first power source 1100 is calculated, and when only the second power source 1200 is discharging, the full charge capacity of the second power source 1200 is calculated.

When the first power source 1100 is discharging, the capacity calculation unit 1440 calculates a total full charge capacity of the hybrid battery 1000 by adding the calculated full charge capacity (namely, the first full charge capacity or the second full charge capacity) of the first power source 1100 and already calculated and stored full charge capacity of the second power source 1200. Of course, when the second power source 1200 is discharging, the capacity calculation unit 1440 calculates a total full charge capacity of the hybrid battery 1000 by adding the calculated full charge capacity (namely, the first full charge capacity or the second full charge capacity) of the second power source 1200 and the already calculated and stored full charge capacity of the first power source 1100.

As a result, by calculating the full charge capacity of the battery more often during discharging, the full charge capacity of the battery during discharging becomes more accurate. By re-calculation through adding the full charge capacities of two batteries that are discharging or non-discharging, the full charge capacity of a total hybrid battery becomes more accurate. Of course, those skilled in the art would appreciate that the accuracy of the remaining capacity calculation would improve as well.

The memory 1450 stores (or updates) a full charge capacity of the first power source 1100 or the second power source 1200 while the full charge capacity is continuously calculated. For example, the full charge capacity of the first power source 1100 is continuously calculated and stored while the first power source 1100 is being discharged, and the full charge capacity of the second power source 1200 that is not discharging continues to remain as the previously calculated full charge capacity. Also, the full charge capacity of the second power source 1200 is continuously calculated and stored in the memory 1450 while the second power source 1200 is being discharged. The full charge capacity of the first power source 1100 that is not discharging continues to remain as the previously calculated full charge capacity. Also, the memory provides the full charge capacity data of the non-discharging battery when the capacity calculation unit 1440 calculates the full charge capacity of the discharging battery, and adds with the full charge capacity of the non-discharging battery. The program including algorithms, variables, and constants, etc. can be stored in the memory 1450 and the explanation will be omitted because it is known to those skilled in the art.

The communication processing unit 1460 can be a device using an interface method such as an SMBus that includes clock and data lines that are used primarily in the smart battery field. The communication processing unit 1460 allows the user to find out information such as the remaining capacity information of the battery through an external system 1500 by transmitting information such as the voltage and current of the battery, full charge capacity, and the remaining capacity to an external system 1500 (For example, the load such as a lap top computer).

Figure 5A:
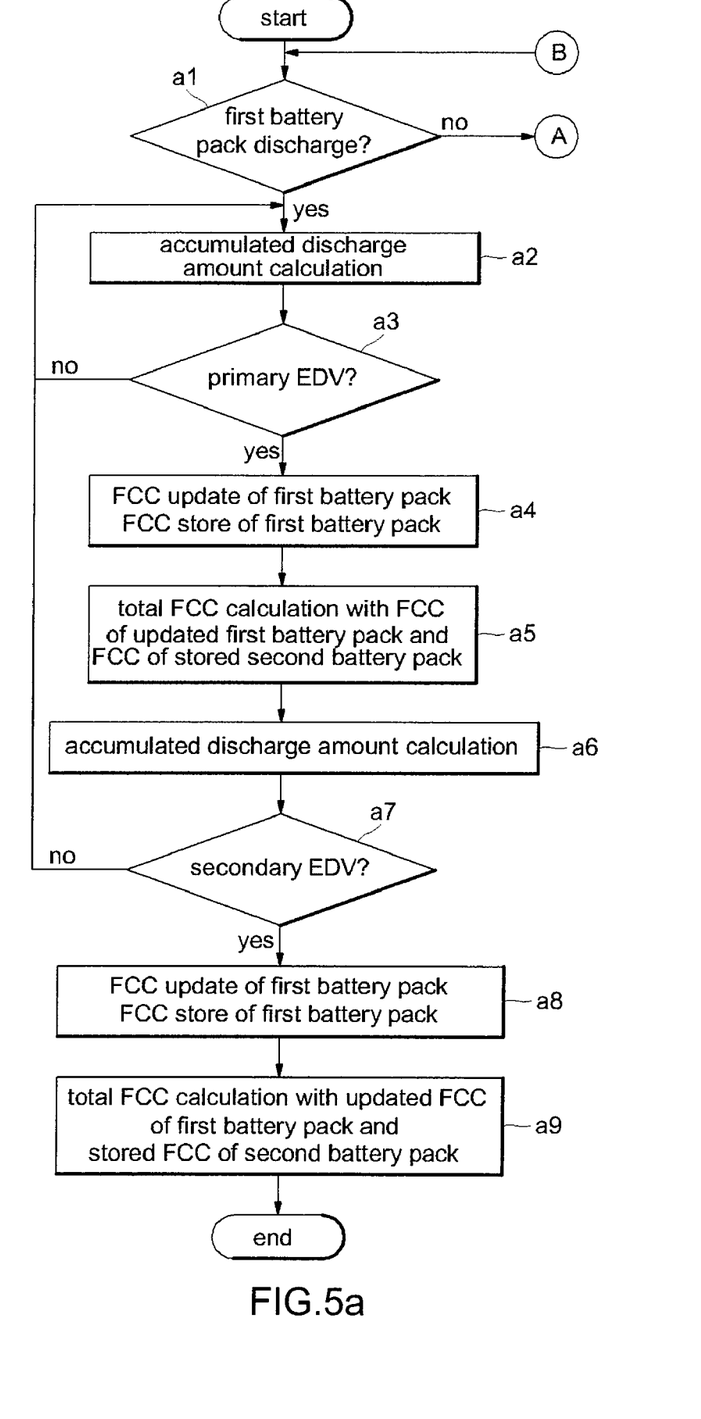
FIG. 5a and FIG. 5b are flow charts that illustrate the full charge capacity calculation method of a hybrid battery of an embodiment according to the present invention.
Figure 5B:
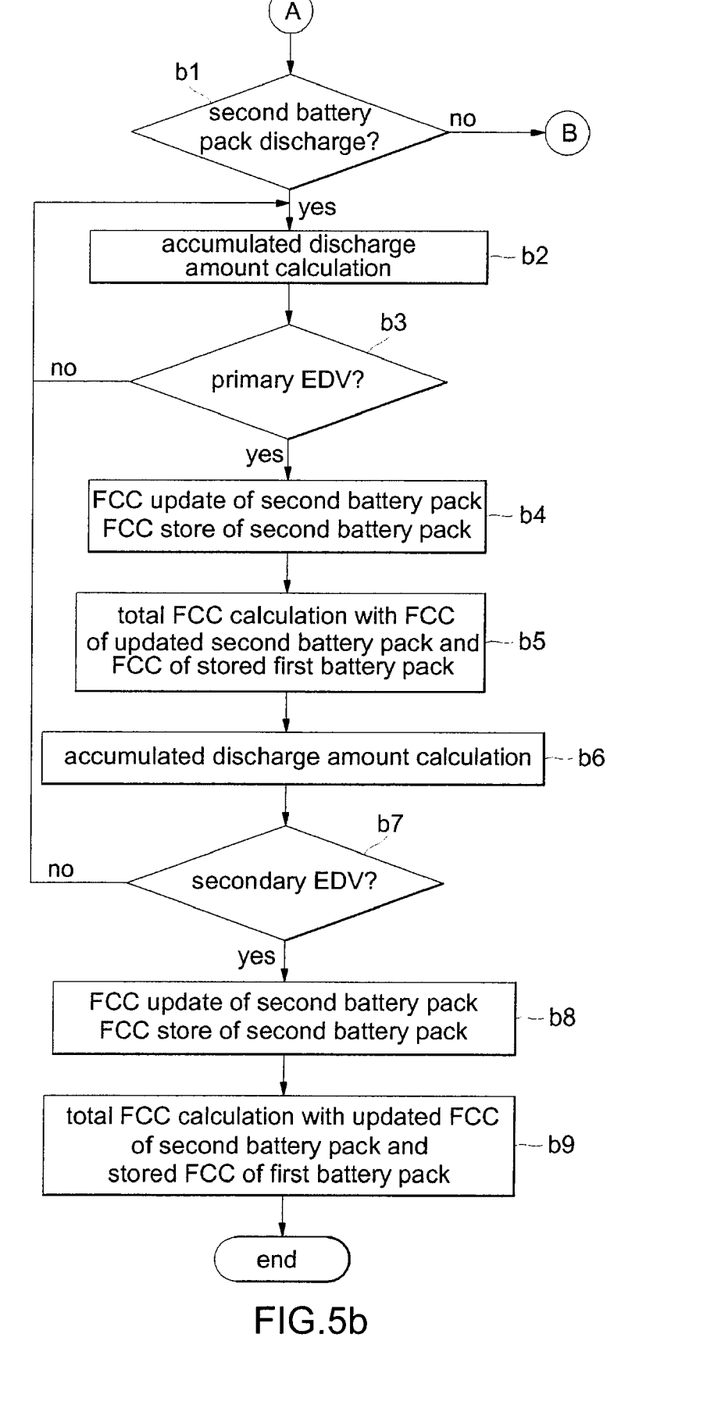

FIG. 5a and FIG. 5b are flow charts that illustrate the full charge capacity calculation method of a hybrid battery of an embodiment according to the present invention.

As illustrated in FIG. 5a, the full charge capacity calculation method of a hybrid battery of an embodiment according to the present invention includes (a1) deciding the discharging condition/status of the first power source 1100, (a2) calculating accumulated discharge amount of the first power source 1100 while the first power source 1100 is being discharged, (a3) deciding whether the first power source 1100 reached a primary discharge voltage level or not, (a4) calculating the full charge capacity of the first power source 1100 when the first power source 1100 reaches the primary discharge voltage level and storing the full charge capacity of the first power source 1100, (a5) calculating the total full charge capacity of the hybrid battery 1000 by adding the calculated full charge capacity of the first power source 1100 to the already stored full charge capacity of the second power source 1200, (a6) calculating an accumulated discharge amount of the first power source 1100 continuously, (a7) deciding whether the first power source 1100 reached the secondary discharge voltage level, (a8) calculating the full charge capacity of the first power source 1100 when the first power source 1100 reaches the secondary discharge voltage level and storing the full charge capacity of the first power source 1100, (a9) calculating a total full charge capacity of the hybrid battery 1000 by adding the full charge capacity of the calculated first power source 1100 to the already stored full charge capacity of the second power source 1200. As illustrated in FIG. 5b, "A" is accomplished when the first power source 1100 is not in a discharging condition/state.

As illustrated in FIG. 5b, the full charge capacity calculation method of a hybrid battery of an embodiment according to the present invention includes (b1) deciding the discharging condition/status of the second power source 1200, (b2) calculating accumulated discharge amount of the second power source 1200 while the second power source 1200 is being discharged, (b3) deciding whether the second power source 1200 reached a primary discharge voltage level or not, (b4) calculating the full charge capacity of the second power source 1200 when the second power source 1200 reaches the primary discharge voltage level and storing the full charge capacity of the second power source 1200, (b5) calculating the total full charge capacity of the hybrid battery 1000 by adding the calculated full charge capacity of the second power source 1200 to the already stored full charge capacity of the first power source 1100, (b6) calculating an accumulated discharge amount of the second power source 1200 continuously, (b7) deciding whether the second power source 1200 reached the secondary discharge voltage level, (b8) calculating the full charge capacity of the second power source 1200 when the second power source 1200 reaches the secondary discharge voltage level and storing the full charge capacity of the second power source 1200, (b9) calculating a total full charge capacity of the hybrid battery 1000 by adding the calculated full charge capacity of the second power source 1200 to the already stored full charge capacity of the first power source 1100. As illustrated in FIG. 5a, "B" is accomplished when the second power source 1200 is not in a discharging condition/state.

Figure 6:
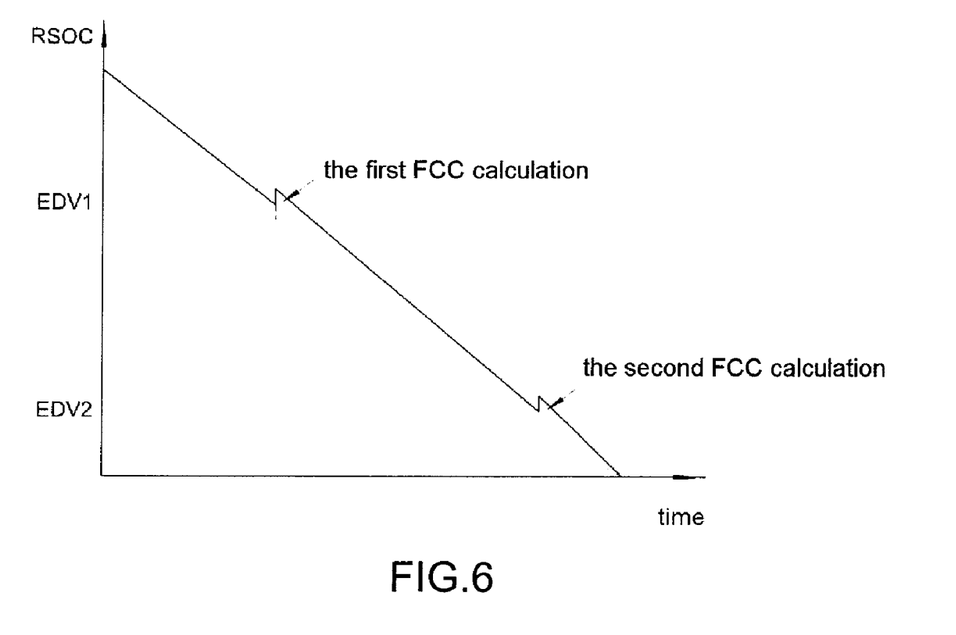
FIG. 6 is a graph that illustrates the full charge capacity calculation method of a hybrid battery of an embodiment according to the present invention.

FIG. 6 is a graph that illustrates a full charge capacity calculation method of a hybrid battery of an embodiment according to the present invention.

As illustrated in FIG. 6, according to embodiments of the present invention, the full charge capacity is calculated at at least two different discharge voltage levels (EDV1, EDV2) while discharging the first power source 1100 or the second power source 1200. Therefore, the remaining capacity can be more accurately calculated by calculating the full charge capacity more accurately. A dotted line in FIG. 6 illustrates the case where the remaining capacity is miscalculated because of an incorrect calculation of the full charge capacity, and the solid line illustrates the case where the remaining capacity is accurately calculated by accomplishing the calculation of the full charge capacity.

The full charge capacity calculation method of a hybrid battery of an embodiment according to the present invention will be explained more specifically below in reference to a block diagram shown in FIG. 4.

In (a1) deciding the discharging status of the first power source 1100, the fuel gauge circuit 1400 decides whether the first power source 1100 is being discharged or not. For example, the fuel gauge circuit 1400 can determine whether the first battery cell 1110 is discharging or charging by monitoring the inputted voltage (e.g., by comparing successive inputted voltages) from the first main protection circuit 1120 to determine whether the inputted voltage is becoming progressively smaller (discharging state) or progressively larger (charging state). Of course, there is no change in the inputted voltage when the first battery cell 1110 is not being charged or discharged.

In (a2) calculating the accumulated discharge amount of the first power source 1100, when the first power source 1100 is discharging, the fuel gauge circuit 1400 calculates the accumulated discharge amount by counting the amount of electric charges flowing through the sense resistor 1300. In other words, the sense resistor 1300 located in series in the charge and discharge path inputs the amount of current to the analog digital converter 1432 in accordance with the amount of current that flows through the sense resistor 1300, the analog digital converter 1432 converts this output to the digital data and outputs to the accumulated discharge amount calculation unit 1430. The accumulated discharge amount calculation unit 1430 calculates the accumulated discharge amount, and provides the accumulation data to the capacity calculation unit 1440.

In (a3) deciding whether the first power source 1100 reached the secondary discharge voltage level, the fuel gauge circuit 1400 decides whether the first power source 1100 is at the primary discharge voltage level (EDV1) using the input information through the first discharge voltage level detection unit 1410.

In (a4) calculating the full charge capacity of the first power source 1100 and storing the full charge capacity of the first power source 1100 when the first power source 1100 reaches the primary discharge voltage level (EDV1), the fuel gauge circuit 1400 calculates the full charge capacity (FCCnew) by adding the value that equals to the accumulated discharge amount until the primary discharge voltage level (EDV1) is reached, and a product of the percentage for the remaining capacity at the primary discharge voltage level (EDV1(%)) and a total full charge capacity (FCC old). Of course, the capacity calculation unit 1440 stores the newly calculated full charge capacity (FCCnew) of the first power source 1100 in the memory 1450.

In (a5) calculating the total full charge capacity of the hybrid battery 1000 by adding the calculated full charge capacity of the first power source 1100 to the already stored full charge capacity of the second power source 1200, the fuel gauge circuit 1400 calculates the total full charge capacity of the hybrid battery 1000 by adding the full charge capacity of the second power source 1200 stored in the memory 1450 and the full charge capacity of the first power source 1100 calculated using the above method.

In (a6) calculating an accumulated discharge amount of the first power source 1100 continuously, the fuel gauge circuit 1400 calculates the accumulated discharge amount of the first power source 1100 at a voltage below the primary discharge voltage level (EDV1) by using the sense resistor 1300.

In (a7) deciding whether the first power source 1100 reached the secondary discharge voltage level, the fuel gauge circuit 1400 decides whether the first power source 1100 is at the secondary discharge voltage level (EDV2) by using the input information through the first discharge voltage level detection unit 1410.

In (a8) calculating the full charge capacity of the first power source 1100 when the first power source 1100 reaches the secondary discharge voltage level and storing the full charge capacity of the first power source 1100, the fuel gauge circuit 1400 calculates the full charge capacity (FCCnew) by adding the value that equals to the accumulated discharge amount until the secondary discharge voltage level (EDV2), and a product of the percentage for the remaining capacity at the secondary discharge voltage level (EDV2(%)) and a total full charge capacity (FCC old). Of course, the capacity calculation unit 1440 stores the newly calculated full charge capacity of the first power source 1100 in the memory 1450.

In (a9) calculating the total full charge capacity of the hybrid battery 1000 by adding the calculated full charge capacity of the first power source 1100 to the already stored full charge capacity of the second power source 1200, the fuel gauge circuit 1400 calculates the total full charge capacity of the hybrid battery 1000 by adding the full charge capacity of the second power source 1200 stored in the memory 1450 and the full charge capacity of the first power source 1100 calculated using the above described method.

Of course, after the full charge capacity calculation of the hybrid battery 1000, the fuel gauge circuit 1400 corrects the remaining capacity of the battery and gives notice to the external system 1500 through the communication processing unit 1460, but the algorithms are a generally known technique so that the explanation will be omitted.

When the second power source 1200 and not the first power source 1100 is in the discharging condition/state, the full charge capacity calculation of the second power source 1200 is similar to the above described method of the full charge capacity calculation of the first power source 1100.

In (b1) deciding the discharging condition/state of the second power source 1200, the fuel gauge circuit 1400 decides whether the second power source 1200 is being discharged or not.

In (b2) calculating the accumulated discharge amount of the second power source 1200 when the second power source 1200 is discharging, the fuel gauge circuit 1400 calculates the accumulated discharge amount by counting the amount of electric charges flowing through the sense resistor 1300.

In (b3) deciding whether the second power source 1200 reached the first discharge voltage level, the fuel gauge circuit 1400 decides whether the second power source 1200 is at the primary discharge voltage level (EDV1) using the input information through the first discharge voltage level detection unit 1410.

In (b4) calculating the full charge capacity of the second power source 1200 and storing the full charge capacity of the first power source 1100 when the second power source 1200 reaches the primary discharge voltage level, the fuel gauge circuit 1400 calculates the full charge capacity (FCCnew) by adding the value that equals to the accumulated discharge amount until the primary discharge voltage level (EDV1) is reached, and a product of the percentage for the remaining capacity at the primary discharge voltage level (EDV1 (%)) and a total full charge capacity (FCCold). Of course, the capacity calculation unit 1440 stores the newly calculated full charge capacity (FCCnew) of the second power source 1200 to the memory 1450.

In (b5) calculating the total full charge capacity of the hybrid battery 1000 by adding the calculated full charge capacity of the second power source 1200 to the already stored full charge capacity of the first power source 1100, the fuel gauge circuit 1400 calculates the total full charge capacity of the hybrid battery 1000 by adding the full charge capacity of the second power source 1200 and the full charge capacity of the first power source 1100 stored in the memory 1450.

In (b6) calculating an accumulated discharge amount of the second power source 1200 continuously, the fuel gauge circuit 1400 calculates the accumulated discharge amount of the second power source 1200 at a voltage below the primary discharge voltage level (EDV1) by using the sense resistor 1300.

In (b7) deciding whether the second power source 1200 reached the secondary discharge voltage level, the fuel gauge circuit 1400 decides whether the second power source 1200 is at the secondary discharge voltage level by using the input information through the first discharge voltage level detection unit 1410.

In (b8) calculating the full charge capacity of the second power source 1200 when the second power source 1200 reaches the secondary discharge voltage level and storing the full charge capacity of the second power source 1200, the fuel gauge circuit 1400 calculates the full charge capacity (FC-Cnew) by adding the value that equals to the accumulated discharge amount until the secondary discharge voltage level (EDV2) and a product of the percentage for the remaining capacity at the secondary discharge voltage level (EDV2(%)) and a total full charge capacity (FCCold). Of course, the capacity calculation unit 1440 stores the newly calculated full charge capacity of the second power source 1200 in the memory 1450.

In (a9) calculating the total full charge capacity of the hybrid battery 1000 by adding the calculated full charge capacity of the second power source 1200 to the already stored full charge capacity of the first power source 1100, the fuel gauge circuit 1400 calculates the total full charge capacity of the hybrid battery 1000 by adding the full charge capacity of the second power source 1200 and the full charge capacity of the first power source 1100 stored in the memory 1450.

Of course, after the full charge capacity calculation of the hybrid battery 1000, the fuel gauge circuit 1400 corrects the remaining capacity of the battery and gives notice to the external system 1500 through the communication processing unit 1460, but the algorithms include a generally known technique so that the explanation will be omitted.

As described above, a hybrid battery and full charge capacity calculation method thereof according to exemplary embodiments of the present invention can calculate the remaining capacity of the battery more accurately by calculating the full charge capacity of the battery at at least two discharge voltage levels.

A hybrid battery and full charge capacity calculation method thereof according to exemplary embodiments of the present invention can calculate a total full charge capacity of a hybrid battery by adding the already stored full charge capacity of another battery that is not discharging after calculating the full charge capacity of the discharging battery. Therefore, the total remaining capacity of the whole hybrid battery can be calculated more accurately.

A hybrid battery and full charge capacity calculation method thereof according to exemplary embodiments of the present invention is not limited to the exemplary embodiments, instead, those skilled in the art would appreciate that the invention can be altered in various different ways without departing from the spirit or scope of the present invention. By way of example, while the exemplary embodiments have been described primarily in reference to a hybrid battery having two batteries, the present invention is broadly applicable to hybrid batteries including any suitable number of batteries greater than two (e.g., three). Also, while the exemplary embodiments have been described primarily in reference to calculating a full charge capacity at two discharge voltage levels, the present invention is broadly applicable to calculating a full charge capacity at more than two (e.g., three) discharge voltage levels for each battery in the hybrid battery. The scope of the invention is to be defined by the appended claims and their equivalents.

What is claimed is:

1. A hybrid battery comprising:
   a first power source adapted to output a first voltage;
   a second power source, which is parallel to the first power source and adapted to output a second voltage;
   a sense resistor, which is in series with the first power source and the second power source and adapted to sense and output current information of at least one of the first power source or the second power source; and
   a fuel gauge circuit adapted to calculate a first accumulated discharge amount using the current information from the sense resistor when a voltage of a currently discharging one of the first power source or the second power source reaches a first discharge voltage level, and to add a first capacity corresponding to the first discharge voltage level to the first accumulated discharge amount to calculate a first full charge capacity.

2. The hybrid battery as claimed in claim 1, wherein the first capacity is calculated by multiplying a previous full charge capacity with a percentage of remaining capacity corresponding to the first discharge voltage level.

3. The hybrid battery as claimed in claim 1, wherein the fuel gauge circuit is further adapted to calculate a second accumulated discharge amount using the current information from the sense resistor when the voltage of the currently discharging one of the first power source or the second power source reaches a second discharge voltage level, wherein the second discharge voltage level is lower than the first discharge voltage level, and to calculate a second full charge capacity by adding a second capacity corresponding to the second discharge voltage level to the second accumulated discharge amount.

4. The hybrid battery as claimed in claim 3, wherein the second capacity is calculated by multiplying a previous full charge capacity with a percentage of remaining capacity corresponding to the second discharge voltage level.

5. The hybrid battery as claimed in claim 1, wherein the fuel gauge circuit comprises:

a first discharge voltage level detector for detecting at least two discharge voltage levels different from each other while the first power source is discharging;

a second discharge voltage level detector for detecting at least two discharge voltage levels different from each other while the second power source is discharging;

an accumulated discharge amount calculator for calculating an accumulated discharge amount using the current information from the sense resistor; and a capacity calculator for calculating a full charge capacity by adding remaining capacity corresponding to one of the discharge voltage levels to the accumulated discharge amount when the discharge voltage level obtained from the first discharge voltage level detector or the second discharge voltage level detector reaches a preset discharge voltage level.

6. The hybrid battery as claimed in claim 5, wherein the capacity calculator calculates the first capacity by multiplying a percentage of remaining capacity corresponding to the discharge voltage level with a previous full charge capacity.

7. The hybrid battery as claimed in claim 1, wherein the fuel gauge circuit, after calculating the full charge capacity of the discharging one of the first power source or the second power source, adds a previously stored full charge capacity of a currently non-discharging one of the first power source or the second power source to calculate a new total full charge capacity.

8. The hybrid battery as claimed in claim 1, wherein the first power source and the second power source comprise rechargeable batteries.

9. The hybrid battery as claimed in claim 1, wherein at least one of the first power source or the second power source comprises at least one of a cylindrical lithium ion battery, a rectangular lithium ion battery, a pouch type lithium polymer battery or a pouch type lithium ion battery.

10. The hybrid battery as claimed in claim 1, wherein the first power source and the second power source are different from each other in at least one of shape, chemical property, capacity or charge/discharge voltage.

11. A method of calculating a full charge capacity of a hybrid battery comprising a first power source and a second power source, which are different from each other in at least one of shape, chemical property, capacity or charge/discharge voltage, the method comprising:

calculating a first accumulated discharge amount of the first power source while the first power source is discharging, and determining whether a first discharge voltage level of the first power source has been reached;

adding the first accumulated discharge amount of the first power source, which has been accumulated until the first discharge voltage level was reached for the first power source, to a first capacity of the first power source corresponding to the first discharge voltage level of the first power source, to calculate a first full charge capacity of the first power source;

calculating a second accumulated discharge amount of the first power source while the first power source is discharging, and determining whether a second discharge voltage level of the first power source, which is lower than the first discharge voltage level of the first power source, has been reached; and adding the second accumulated discharge amount of the first power source, which has been accumulated until the second discharge voltage level was reached for the first power source, to a second capacity of the first power source corresponding to the second discharge voltage level of the first power source, to calculate a second full charge capacity of the first power source.

12. The method as claimed in claim 11, wherein the first capacity or the second capacity of the first power source is obtained, respectively, by multiplying a percentage of remaining capacity of the first power source corresponding to the respective first discharge voltage level or the second discharge voltage level of the first power source with a previous full charge capacity of the first power source.

13. The method as claimed in claim 11, wherein after respective calculation of the first full charge capacity or the second full charge capacity of the first power source, further comprising storing the first full charge capacity or the second full charge capacity, respectively, of the first power source in a memory.

14. The method as claimed in claim 11, wherein, after respective calculation of the first full charge capacity or the second full charge capacity of the first power source, further comprising adding the first full charge capacity or the second full charge capacity, respectively, of the first power source to a previously stored full charge capacity of the second power source, to calculate a total full charge capacity.

15. A method of calculating a full charge capacity of a hybrid battery comprising a first power source and a second power source, which are different from each other in at least one of shape, chemical property, capacity or charge/discharge voltage, the method comprising:

calculating a first accumulated discharge amount of the second power source while the second power source is discharging, and determining whether a first discharge voltage level of the second power source has been reached;

adding the first accumulated discharge amount of the second power source, which has been accumulated until the first discharge voltage level was reached for the second power source, to a first capacity of the second power source corresponding to the first discharge voltage level of the second power source, to calculate a first full charge capacity of the second power source;

calculating a second accumulated discharge amount of the second power source while the second power source is discharging, and determining whether a second discharge voltage level of the second power source, which is lower than the first discharge voltage level of the second power source, has been reached; and adding the second accumulated discharge amount of the second power source, which has been accumulated until the second discharge voltage level was reached for the second power source, to a second capacity of the second power source corresponding to the second discharge voltage level of the second power source, to calculate a second full charge capacity of the second power source.

16. The method as claimed in claim 15, wherein the first capacity or the second capacity of the second power source is obtained, respectively, by multiplying a percentage of remaining capacity of the second power source corresponding to the respective first discharge voltage level or the second discharge voltage level of the second power source with a previous full charge capacity of the second power source.

17. The method as claimed in claim 15, wherein after respective calculation of the first full charge capacity or the second full charge capacity of the second power source, further comprising storing the first full charge capacity or the second full charge capacity, respectively, of the second power source in a memory.

18. The method as claimed claim 15, wherein, after respective calculation of the first full charge capacity or the second full charge capacity of the second power source, further comprising adding the first full charge capacity or the second full charge capacity, respectively, of the second power source to a previously stored full charge capacity of the first power source, to calculate another total full charge capacity.

* * * * *

UNITED STATES PATENT AND TRADEMARK OFFICE
CERTIFICATE OF CORRECTION

PATENT NO. : 7,737,660 B2  Page 1 of 1
APPLICATION NO. : 11/843586
DATED : June 15, 2010
INVENTOR(S) : Changyong Yun It is certified that error appears in the above-identified patent and that said Letters Patent is hereby corrected as shown below:

In the Claims

Column 22, Claim 18, line 10                 After "claimed" Insert -- in --

Signed and Sealed this
Sixteenth Day of August, 2011

David J. Kappos
*Director of the United States Patent and Trademark Office*